US012494344B2

(12) United States Patent
Saito et al.

(10) Patent No.: US 12,494,344 B2
(45) Date of Patent: Dec. 9, 2025

(54) ANTENNA FOR INDUCTIVELY COUPLED PLASMA EXCITATION, ANTENNA UNIT FOR INDUCTIVELY COUPLED PLASMA EXCITATION, AND PLASMA PROCESSING APPARATUS

(71) Applicant: Tokyo Electron Limited, Tokyo (JP)

(72) Inventors: Takehisa Saito, Miyagi (JP); Yohei Yamazawa, Miyagi (JP); Toshiki Nakajima, Miyagi (JP); Daisuke Kurashina, Miyagi (JP); Naoki Fujiwara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 424 days.

(21) Appl. No.: 17/675,228

(22) Filed: Feb. 18, 2022

(65) Prior Publication Data

US 2022/0270851 A1 Aug. 25, 2022

(30) Foreign Application Priority Data

Feb. 19, 2021 (JP) ................................ 2021-025292

(51) Int. Cl.

*H01J 37/32* (2006.01)
*H01Q 1/36* (2006.01)

(52) U.S. Cl.

CPC .......... *H01J 37/3211* (2013.01); *H01Q 1/362* (2013.01); *H01J 2237/327* (2013.01)

(58) Field of Classification Search

CPC ............. H01J 37/3211; H01J 2237/327; H01J 37/32623; H01J 2237/3321; H01J 2237/334; H01J 15/00; H01J 37/32091; H01J 37/32082; H01J 37/3244; H01J 37/32009; H01J 37/32532; H01J 37/321; H01J 37/32174; H01Q 1/362; H05H 1/2465; C23C 16/507; C23C 16/509; C23C 16/5096; C23C 16/45565; C23C 16/455; C23C 16/45591; C23C 16/4412; C23C 16/452; H01L 21/67069

USPC ......... 118/723 I, 723 IR, 723 E; 156/345.48, 156/345.49

See application file for complete search history.

(56) References Cited

U.S. PATENT DOCUMENTS 5,891,252 A * 4/1999 Yokogawa ........ H01J 37/32082 118/723 AN
5,944,902 A 8/1999 Redeker et al.
6,401,652 B1 6/2002 Mohn et al.
2002/0121345 A1* 9/2002 Chen .................... C23C 16/507 156/345.48
2012/0152901 A1* 6/2012 Nagorny .......... H01J 37/32715 216/68
2012/0248066 A1* 10/2012 Yamazawa ........ H01J 37/32174 216/68

(Continued)

FOREIGN PATENT DOCUMENTS

KR 10-2010-0030806 A 3/2010
WO 2020/146189 A1 7/2020

*Primary Examiner* — Rudy Zervigon
(74) *Attorney, Agent, or Firm* — XSENSUS LLP

(57) ABSTRACT

There is provided an antenna for inductively coupled plasma excitation. The antenna comprises a plurality of coil assemblies and a conductive plate connected to the plurality of coil assemblies, the conductive plate having a central opening and at least one plate terminal.

20 Claims, 12 Drawing Sheets

(56) References Cited

U.S. PATENT DOCUMENTS

| | | | | |
|---|---|---|---|---|
| 2014/0020837 | A1* | 1/2014 | Nguyen | H05H 1/46<br>156/345.48 |
| 2014/0020838 | A1* | 1/2014 | Kenney | H01J 37/321<br>156/345.48 |
| 2014/0020839 | A1* | 1/2014 | Kenney | H01J 37/321<br>156/345.48 |
| 2014/0021861 | A1* | 1/2014 | Carducci | H01J 37/32183<br>315/111.51 |
| 2014/0265832 | A1* | 9/2014 | Kenney | H01J 37/3211<br>315/34 |
| 2019/0074164 | A1* | 3/2019 | Li | H01J 37/321 |
| 2022/0108871 | A1* | 4/2022 | Yamazawa | H01J 37/3211 |
| 2024/0242936 | A1* | 7/2024 | Hirayama | H01J 37/3244 |

* cited by examiner

ANTENNA FOR INDUCTIVELY COUPLED PLASMA EXCITATION, ANTENNA UNIT FOR INDUCTIVELY COUPLED PLASMA EXCITATION, AND PLASMA PROCESSING APPARATUS

CROSS-REFERENCE TO RELATED APPLICATION

This application claims priority to Japanese Patent Application No. 2021-025292 filed on Feb. 19, 2021, the entire contents of which are incorporated herein by reference.

TECHNICAL FIELD

The present disclosure relates to an antenna for inductively coupled plasma excitation, an antenna unit for inductively coupled plasma excitation, and a plasma processing apparatus.

BACKGROUND

U.S. Pat. No. 5,944,902 discloses an antenna for generating plasma in a processing chamber. The antenna has two annular coil turns, i.e., a central coil turn and an outer coil turn. The central coil turn and the outer coil turn are connected by a plurality of conductors extending in a radial path or an arc path. An RF generation system including an RF source and an RF match network is connected to the central coil turn, and an RF power is supplied to the central coil turn by antenna connection. The outer coil turn is grounded by ground connection.

U.S. Pat. No. 6,401,652 discloses an inductive coil antenna for inductively coupling an RF plasma source power to the plasma. The inductive coil antenna has a plurality of windings connected by a plurality of radial arms from a common antenna center. The center of the antenna is driven by an RF plasma source generator via an impedance matching circuit. Multiple outer ends of the winding are grounded.

SUMMARY

The technique of the present disclosure improves circumferential uniformity of a magnetic field strength while improving a generation efficiency of a magnetic field by the antenna for inductively coupled plasma excitation at the time of exciting plasma using the antenna for inductively coupled plasma excitation.

There is provided an antenna for inductively coupled plasma excitation, the antenna comprising: a plurality of coil assemblies; and a conductive plate connected to the plurality of coil assemblies, the conductive plate having a central opening and at least one plate terminal.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
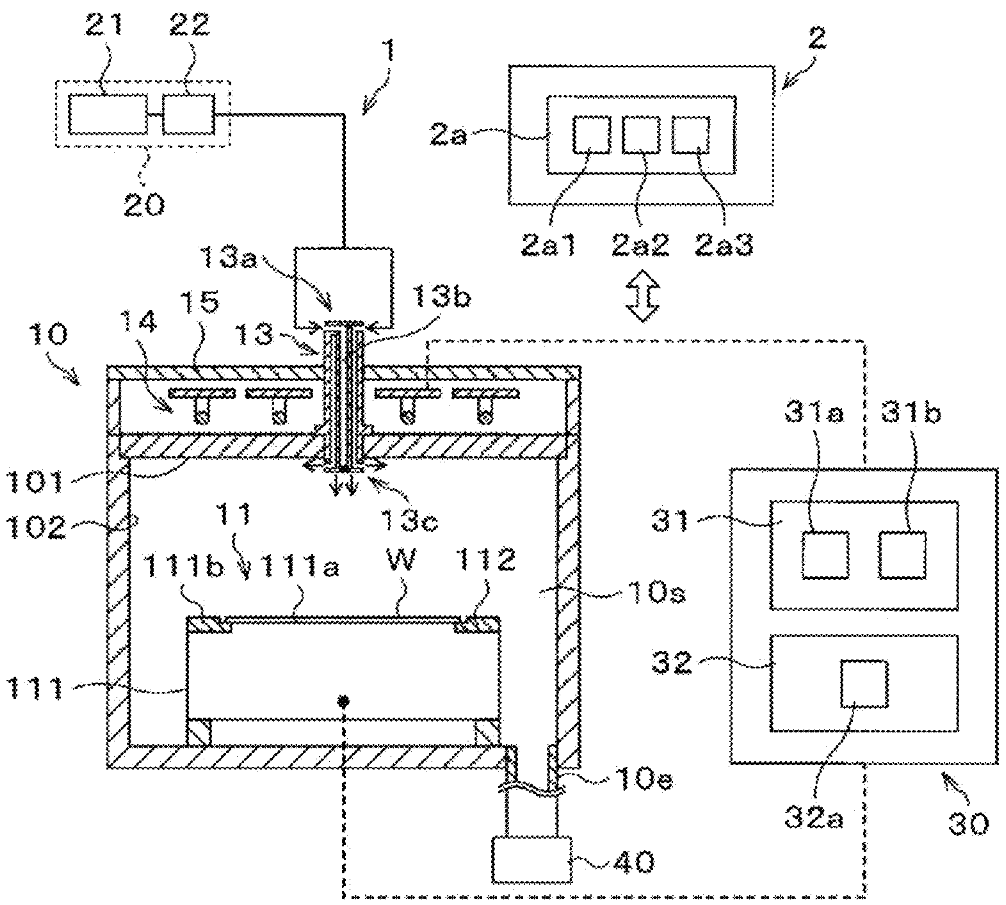
FIG. 1 is a cross-sectional view showing a schematic configuration of a plasma processing system.

In a semiconductor device manufacturing process, plasma processing such as etching, film formation, or the like is performed on a semiconductor substrate. In the plasma processing, the semiconductor substrate is processed by plasma generated by exciting a processing gas.

Inductively coupled plasma (ICP) can be used as one of plasma sources, for example. Each of the antennas for exciting inductively coupled plasma, which are disclosed in U.S. Pat. Nos. 5,944,902 and 6,401,652, includes a plurality of coils.

An RF power supply or an impedance matching circuit connected to the antenna is expensive. Therefore, conventionally, as disclosed in. U.S. Pat. Nos. 5,944,902 and 6,401,652, for example, the RF power from the RF power supply or the impedance matching circuit is supplied only to the center of the antenna, and the current is branched from the center of the antenna to a plurality of coils through branch lines. In that case, the branch lines to the coils are close at the branch portion at the center of the antenna, so that inductive coupling occurs and a current distribution ratio is biased. The inductive coupling includes, e.g., a case where the RF power supply line and the branch lines are inductively coupled or a case where the branch lines are inductively coupled with each other. Accordingly, the circumferential uniformity of the strength of the magnetic field generated by the antenna deteriorates.

An opening into which a central gas injector (CGI) that is a passage of a processing gas is inserted may be formed at the center of the antenna. In that case, a magnetic force lines are generated at the opening formed at the center of the antenna, so that a dielectric electromotive force is generated. Hence, the generation efficiency of the magnetic field by the antenna deteriorates.

The technique of the present disclosure improves the circumferential uniformity of the magnetic field strength while improving the generation efficiency of the magnetic field by the antenna for inductively coupled plasma excitation at the time of exciting plasma using the antenna. Hereinafter, a plasma processing apparatus and the antenna for inductively coupled plasma excitation according to embodiments will be described with reference to the accompanying drawings. Like reference numerals will be given to like or corresponding parts throughout this specification and the drawings, and redundant description thereof will be omitted.

<Configuration of Plasma Processing System>

Hereinafter, a configuration example of a plasma processing system will be described. FIG. 1 is a cross-sectional view showing a schematic configuration of the plasma processing system. In the plasma processing system of the present embodiment, plasma processing is performed on a substrate (wafer) W using inductively coupled plasma. The substrate W to be subjected to plasma processing is not limited to a wafer.

The plasma processing system includes an inductively coupled plasma processing apparatus 1 and a controller 2. The inductively coupled plasma processing apparatus 1 includes a plasma processing chamber 10, a gas supplier 20, a power supply 30, and an exhaust system 40. The plasma processing chamber 10 includes a dielectric window 101 and a sidewall 102. The plasma processing apparatus 1 further includes a substrate support 11, a gas inlet portion, an antenna unit (antenna for inductively coupled plasma excitation) 14, and a conductor plate 15. The substrate support 11 is disposed in the plasma processing chamber 10. The antenna unit 14 is disposed on or above the plasma processing chamber 10 (i.e., on or above the dielectric window 101) to surround a central gas injector 13 to be described later. The antenna unit 14 may be disposed to surround another hollow member such as an EPD window or the like. In this case, another hollow member is partially or entirely made of an insulating material such as quartz. The insulating material may be a ceramic material other than quartz. The conductor plate 15 is disposed above the antenna unit 14. The plasma processing chamber 10 has a plasma processing space 10*s* defined by the dielectric window 101, the sidewall 102, and the substrate support 11. The plasma processing chamber 10 has at least one gas supply port for supplying at least one processing gas to the plasma processing space 10*s*, and at least one gas discharge port for discharging a gas from the plasma processing space.

The substrate support 11 includes a main body 111 and a ring assembly 112. The main body 111 has a central region (substrate supporting surface) 111*a* for supporting the substrate W and an annular region (ring supporting surface) 111*b* for supporting the ring assembly 112. The annular region 111*b* of the main body 111 surrounds the central region 111*a* of the main body 111 in plan view. The substrate W is disposed on the central region 111*a* of the main body 111, and the ring assembly 112 is disposed on the annular region 111*b* of the main body 111 to surround the substrate W on the central region 111*a* of the main body 111. In one embodiment, the main body 111 includes a base and an electrostatic chuck. The base includes a conductive member. The conductive member of the base functions as a lower electrode. The electrostatic chuck is placed on the base. An upper surface of the electrostatic chuck has the substrate supporting surface 111*a*. The ring assembly 112 includes one or more annular members. At least one of the one or more annular members is an edge ring. Further, although it is not illustrated, the substrate support 11 may include a temperature control module configured to adjust at least one of the electrostatic chuck, the ring assembly 112, and the substrate W to a target temperature. The temperature control module may include a heater, a heat transfer medium, a flow path, or a combination thereof. A heat transfer fluid such as brine or a gas flows through the flow path. Further, the substrate support 11 may include a heat transfer gas supplier configured to supply a heat transfer gas to a space between the backside of the substrate W and the substrate supporting surface 111*a*.

The gas inlet portion is configured to introduce at least one processing gas from the gas supplier 20 into the plasma processing space 10*s*. In one embodiment, the gas inlet portion includes the central gas injector (CGI) 13 that is a hollow member. In one embodiment, the central gas injector 13 is partially or entirely made of an insulating material such as quartz. The insulating material may be a ceramic material other than quartz. The central gas injector 13 is disposed above the substrate support 11 and is attached to the central opening formed in the dielectric window 101. The central gas injector 13 has at least one gas supply port 13*a*, at least one gas flow path 13*b*, and at least one gas inlet port 13*c*. The processing gas supplied to the gas supply port 13*a* passes through the gas flow path 13*b* and is introduced into the plasma processing space 10*s* from the gas inlet port 13*c*. The gas inlet portion may include, in addition to or instead of the central gas injector 13, one or a plurality of side gas injectors (SGI) attached to one or a plurality of openings formed in the sidewall 102.

The gas supplier 20 may include at least one gas source 21 and at least one flow rate controller 22. In one embodiment, the gas supplier 20 is configured to supply at least one processing gas from the corresponding gas source 21 to the central gas injector 13 through the corresponding flow rate controller 22. The flow rate controllers 22 may include, e.g., a mass flow controller or a pressure-controlled flow rate controller. Further, the gas supplier 20 may include one or more flow rate modulation devices for modulating the flow rate of at least one processing gas or causing it to pulsate.

The power supply 30 includes an RF power supply 31 connected to the plasma processing chamber 10 through at least one impedance matching circuit. The RF power supply 31 is configured to supply at least one RF signal (RF power), such as a source RF signal and a bias RF signal, to the conductive member of the substrate support 11 and the antenna unit 14. Accordingly, plasma is produced from at least one processing gas supplied to the plasma processing space 10*s*. Therefore, the RF power supply 31 may function as at least a part of a plasma generator configured to generate plasma from one or more processing gases in the plasma processing chamber 10. Further, by supplying the bias RF signal to the conductive member of the substrate support portion 11, a bias potential is generated at the substrate W, and ions in the produced plasma can be attracted to the substrate W.

In one embodiment, the RF power supply 31 includes a first RF generator 31*a* and a second RF generator 31*b*. The first RF generator 31*a* is connected to the antenna unit 14 and is configured to generate a source RF signal (source RF power) for plasma generation through at least one impedance matching circuit. In one embodiment, the source RF signal has a frequency within a range of 13 MHz to 150

MHz. In one embodiment, the first RF generator 31*a* may be configured to generate a plurality of source RF signals having different frequencies. The generated single or multiple source RF signals are supplied to the antenna unit 14. The second RF generator 31*b* is connected to the conductive member of the substrate support 11 through at least one impedance matching circuit, and is configured to generate a bias RF signal (bias RF power). In one embodiment, the bias RF signal has a frequency lower than that of the source RF signal. In one embodiment, the bias RF signal has a frequency within a range of 400 kHz to 13.56 MHz. In one embodiment, the second RF generator 31*b* may be configured to generate a plurality of bias RF signals having different frequencies. The generated single or multiple bias RF signals are supplied to the conductive member of the substrate support 11. Further, in various embodiments, at least one of the source RF signal and the bias RF signal may be pulsated.

Further, the power supply 30 may include a DC power supply 32 connected to the plasma processing chamber 10. The DC power supply 32 includes a bias DC generator 32*a*. In one embodiment, the bias DC generator 32*a* is connected to the conductive member of the substrate support 11 and is configured to generate a bias DC signal. The generated bias DC signal is applied to the conductive member of the substrate support 11. In one embodiment, the bias DC signal may be applied to another electrode, such as an electrode in an electrostatic chuck. In various embodiments, the bias DC signal may be pulsated. The bias DC generator 32*a* may be provided in addition to the RF power supply 31, or instead of the second RF generator 31*b*.

The exhaust system 40 may be connected to a gas outlet 10*e* disposed at a bottom portion of the plasma processing chamber 10, for example. The exhaust system 40 may include a pressure control valve and a vacuum pump. The pressure control valve adjusts a pressure in the plasma processing space 10*s*. The vacuum pump may include a turbo molecular pump, a dry pump, or a combination thereof.

The controller 2 processes computer-executable instructions that cause the plasma processing apparatus 1 to perform various steps described in the present disclosure. The controller 2 may be configured to control individual components of the plasma processing apparatus 1 to perform various steps described herein. In one embodiment, a part or all of the controller 2 may be included in the plasma processing apparatus 1. The controller 2 may include, e.g., a computer 2*a*. The computer 2*a* may include, e.g., a central processing unit (CPU) 2*a*1, a storage device 2*a*2, and a communication interface 2*a*3. The central processing unit 2*a*1 may be configured to perform various control operations based on a program stored in the storage device 2*a*2. The storage device 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 through a communication line such as a local area network (LAN) or the like.

First Embodiment

Figure 2:
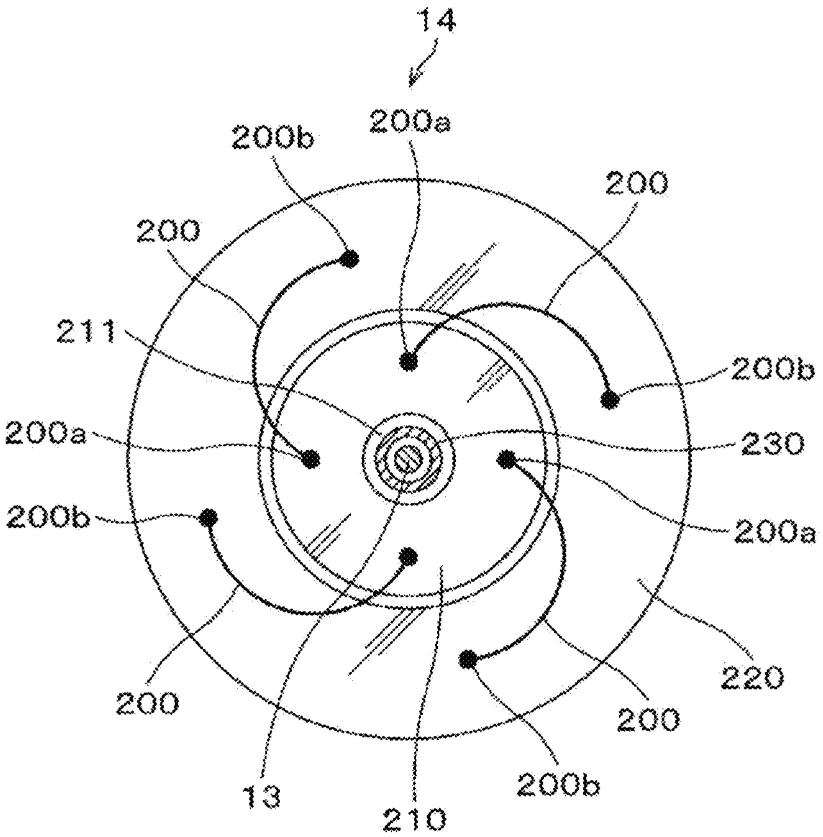
FIG. 2 is a bottom plan view showing a schematic configuration of an antenna unit according to a first embodiment.
Figure 3:
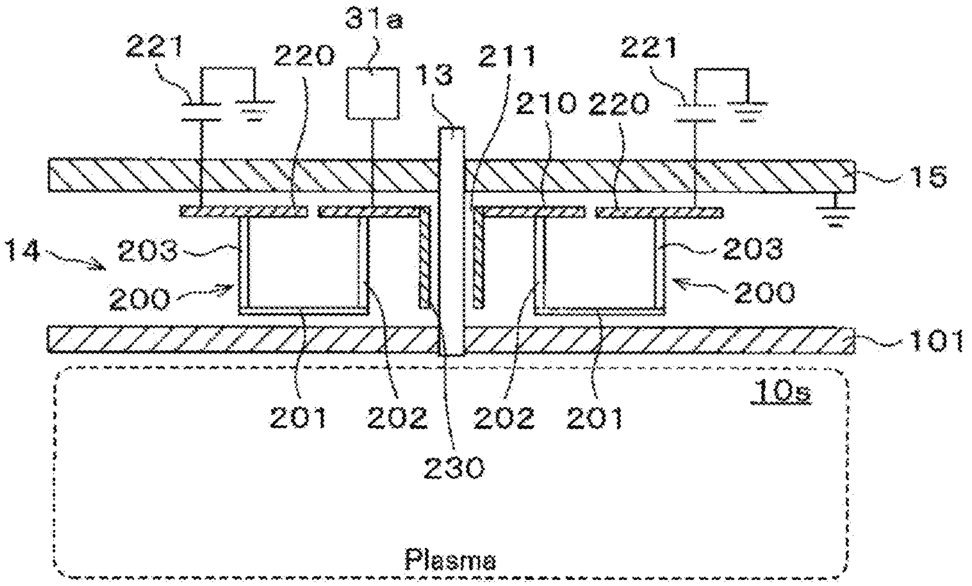
FIG. 3 is a cross-sectional view showing the schematic configuration of the antenna unit according to the first embodiment.
Figure 4:
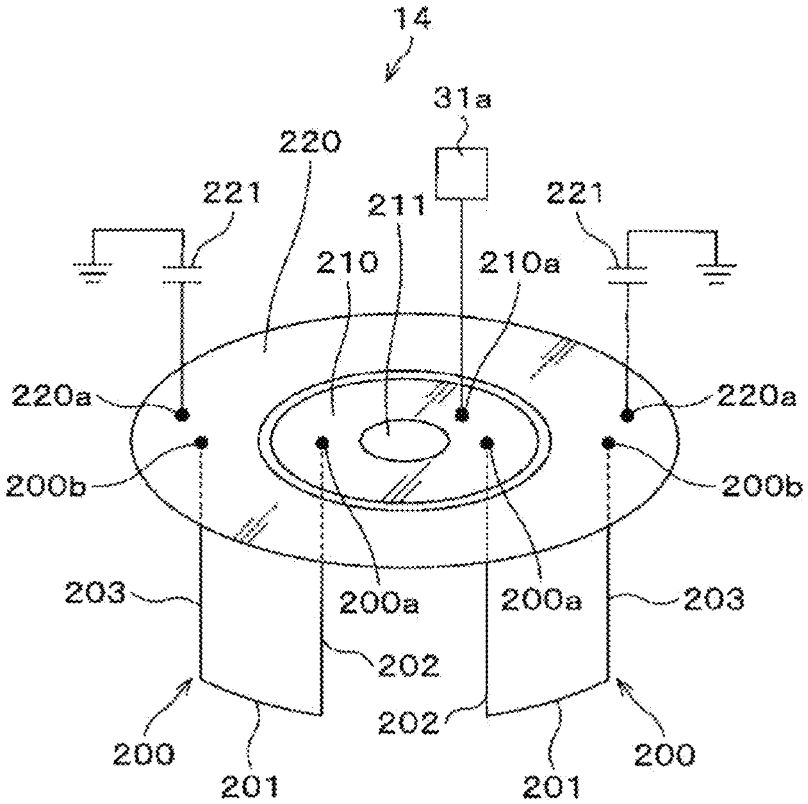
FIG. 4 is a perspective view showing the schematic configuration of the antenna unit according to the first embodiment.

Next, a configuration example of the antenna unit 14 according to a first embodiment will be described. FIG. 2 is a bottom plan view showing a schematic configuration of the antenna unit 14. FIG. 3 is a cross-sectional view showing the schematic configuration of the antenna unit 14. FIG. 4 is a perspective view showing the schematic configuration of the antenna unit 14.

The antenna unit 14 includes at least one antenna. In this embodiment, the antenna unit 14 includes an antenna having a plurality of coil assemblies 200, an inner conductive plate 210, an outer conductive plate 220, and a conductive cylindrical portion (conductive hollow member) 230.

In the illustrated example, four coil assemblies 200 are illustrated. However, the number of coil assemblies 200 is not particularly limited. The coil assemblies 200 are arranged above the dielectric window 101. Further, the coil assemblies 200 are axially symmetric with respect to the center of the inner conductive plate 210.

Each coil assembly 200 has a coil segment 201 and vertical coil segments 202 and 203. The coil segment 201 extends in a horizontal direction or extends obliquely with respect to the horizontal direction, and is disposed at a bottom portion of the coil assembly 200. The coil segment 201 is also referred to as a plasma facing segment extending in a direction facing the plasma processing space 10*s*. One vertical coil segment 202 extends upward from the coil segment 201 and is connected to a bottom surface of the inner conductive plate 210 through the coil terminal 200*a*. The one vertical coil segment 202 may be connected to an upper surface of the inner conductive plate 210. The other vertical coil segment 203 extends upward from the coil segment 201 and is connected to a bottom surface of the outer conductive plate 220 through the coil terminal 200*b*. The other vertical coil segment 203 may be connected to an upper surface of the outer conductive plate 220. In other words, the coil assembly 200 connects the inner conductive plate 210 and the outer conductive plate 220.

The inner conductive plate 210 is disposed above the coil assemblies 200. In other words, the inner conductive plate 210 is separated from the plasma processing space 10*s* where plasma is generated, and is disposed near the conductor plate 15. Further, the inner conductive plate 210 is disposed around the substantially cylindrical central gas injector 13 to surround the central gas injector 13. The inner conductive plate 210 has a substantially circular shape in plan view, and has a central opening 211. The shape of the inner conductive plate 210 is not particularly limited, and the inner conductive plate 210 may have a rectangular shape, for example. The central gas injector 13 is inserted into the central opening 211. A central plate terminal 210*a* is disposed on the upper surface of the inner conductive plate 210. The central plate terminal 210*a* may be disposed on the bottom surface of the inner conductive plate 210. The central plate terminal 210*a* is connected to the first RF generator 31*a* of the power source 30. In other words, the central plate terminal 210*a* is connected to the RF potential. The central plate terminal 210*a* may be directly connected to the RF potential, or may be connected to the RF potential through an electric element such as a capacitor, a coil, or the like. In other words, the central plate terminal 210*a* is directly or indirectly connected to the RF potential.

The outer conductive plate 220 is disposed around the inner conductive plate 210 to surround the inner conductive plate 210. The outer conductive plate 220 has an annular shape in plan view. An outer plate terminal 220*a* is disposed on the upper surface of the outer conductive plate 220. The outer plate terminal 220*a* may be disposed on the bottom surface of the outer conductive plate 220. The outer plate terminal 220*a* is connected to the ground, i.e., to the ground potential, through the capacitor 221. The capacitor 221 may be a variable capacitance capacitor. The outer plate terminal

220*a* may be directly connected to the ground potential, or may be connected to the ground potential through another electric element such as a coil. In other words, the outer plate terminal 220*a* is directly or indirectly connected to the ground potential. A plurality of outer plate terminals 220*a* and a plurality of capacitors 221 may be provided. Further, the capacitor 221 is not limited to that of the first embodiment, and may be a capacitor having a fixed capacitance, or may include a plurality of capacitors including a variable capacitance capacitor and/or a fixed capacitance capacitor. The outer plate terminal 220*a* may be connected to another antenna segment.

The conductive cylindrical portion 230 is disposed around the central gas injector 13 to surround the central gas injector 13 inside the central opening 211. The conductive cylindrical portion 230 extends downward from the central opening 211 to a position on or below the dielectric window 101. The conductive cylindrical portion 230 may be connected to the inner conductive plate 210, or may not be connected to the inner conductive plate 210. In other words, the conductive cylindrical portion 230 may be separated from the inner conductive plate 210. Further, the conductive cylindrical portion 230 may be a part of the central gas injector 13.

(Action of Antenna)

In the antenna unit 14 configured as described above, the RF power supplied from the first RF generator 31*a* of the power supply 30 is supplied to the inner conductive plate 210 through the central plate terminal 210*a*. Accordingly, the current branches from the inner conductive plate 210 and flows to the coil assemblies 200. A magnetic field is generated in a vertical axis direction by this current, and an induced electric field is generated in the plasma processing chamber 10 by the generated magnetic field. Due to the induced electric field generated in the plasma processing chamber 10, plasma is produced from the processing gas supplied from the central gas injector 13 into the plasma processing chamber 10. Then, plasma processing such as etching, film formation, or the like is performed on the substrate W on the central region 111*a* by ions or active species in the plasma.

(Effect 1 of Antenna)

Conventionally, as described above, in the case of branching the current from the center of the antenna to the plurality of coils through the branch lines, the magnetic force lines freely pass between the coils, so that a dielectric electromotive force is generated and the generation efficiency of the magnetic field by the antenna deteriorates. On the other hand, in the antenna unit 14 of the first embodiment, the plate-shaped inner conductive plate 210 does not allow the passage of the magnetic force lines, which makes it possible to suppress the inflow of extra magnetic force lines. In other words, the inner conductive plate 210 can be prevented from functioning as a coil. Accordingly, the magnetic field generation efficiency can be improved.

The inner conductive plate 210 is disposed near the conductor plate 15. For example, the distance between the inner conductive plate 210 and the conductor plate 15 is smaller than the diameter of the central opening 211. Therefore, the inflow of the magnetic force lines can be further suppressed.

At the central opening 211, the gap between the inner end portion of the inner conductive plate 210 and the central gas injector 13 is preferably small in order to suppress the inflow of the magnetic force lines. In the first embodiment, the gap therebetween is 20 mm or less, which is a distance required to secure a normally required withstand voltage of the coil, e.g., 20 kV.

Further, it is preferable that the gap between the inner conductive plate 210 and the outer conductive plate 220 is small in order to suppress the inflow of the magnetic force lines.

Since the conductive cylindrical portion 230 is disposed at the central opening 211, the gap in the central opening 211 can be reduced, and the inflow of the magnetic force lines can be further suppressed.

(Effect 2 of Antenna)

Conventionally, as described above, in the case of branching the current from the center of the antenna to the coils through the branch line, the branch lines are close to each other at the branch portion corresponding to the center of the antenna, so that the induction coupling occurs and the current distribution ratio is biased. Accordingly, the circumferential uniformity of the strength of the magnetic field generated by the antenna deteriorates. On the other hand, in the antenna unit 14 of the first embodiment, the plate-shaped inner conductive plate 210 serves as the current branching portion, so that the induction coupling does not occur and there is no bias in the ratio of the current distribution to the coil assemblies 200. Hence, the circumferential uniformity of the magnetic field strength can be improved.

The coil assemblies 200 are axially symmetric with respect to the center of the inner conductive plate 210. In that case, the bias of the ratio of the current distribution to the coil assemblies 200 can be further suppressed.

Second Embodiment

Figure 5:
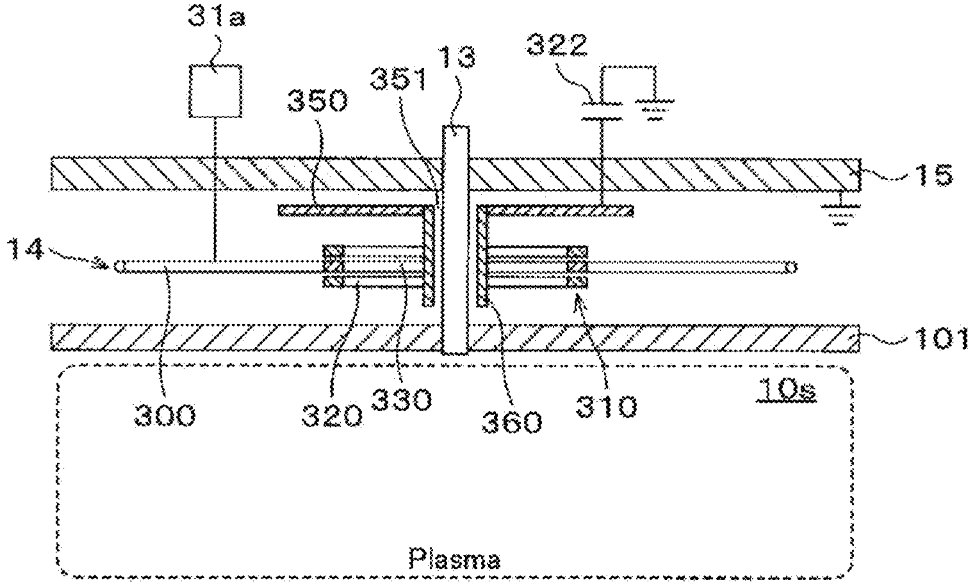
FIG. 5 is a cross-sectional view showing a schematic configuration of an antenna unit according to a second embodiment.
Figure 6:
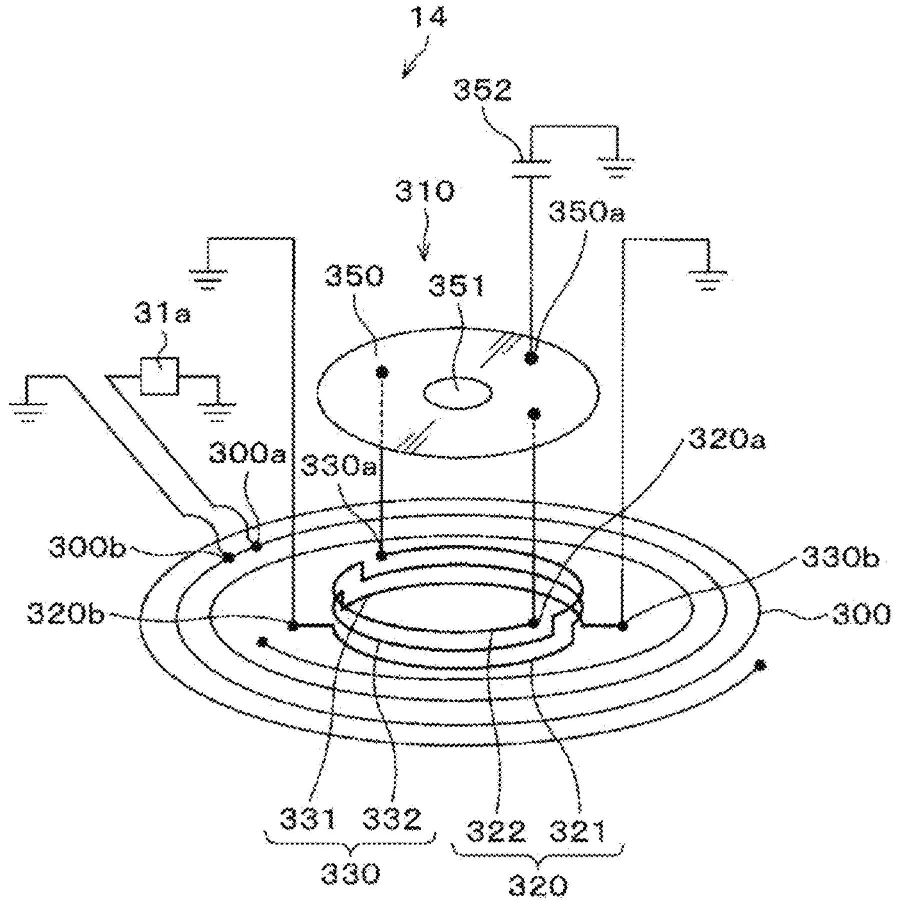
FIG. 6 is a perspective view showing the schematic configuration of the antenna unit according to the second embodiment.

Next, a configuration example of the antenna unit 14 according to a second embodiment will be described. FIG. 5 is a cross-sectional view showing a schematic configuration of the antenna unit 14. FIG. 6 is a perspective view showing the schematic configuration of the antenna unit 14.

The antenna unit 14 includes at least one antenna. In one embodiment, the antenna unit 14 includes a main antenna and a sub-antenna 310. The main antenna includes at least one main coil. In the examples of FIGS. 5 and 6, the main antenna includes one main coil 300. The main coil 300 and the sub-antenna 310 are arranged above the dielectric window 101. The sub-antenna 310 is not necessarily separated from the dielectric window 101. For example, the sub-antenna 310 may be in contact with an upper surface of the dielectric window 101.

The sub-antenna 310 is disposed around the substantially cylindrical central gas injector 13 to surround the central gas injector 13, and is disposed at a radially inner side of the main coil 300. In other words, the sub-antenna 310 is disposed between the central gas injector 13 and the main coil 300. The main coil 300 is disposed around the central gas injector 13 and the main coil 300 to surround the central gas injector 13 and the main coil 300. Each of the main coil 300 and the sub-antenna 310 has a substantially circular outer shape in plan view. The main coil 300 and the sub-antenna 310 are arranged such that the outer shapes thereof form concentric circles.

The main coil 300 is formed in a substantially circular spiral shape of two or more turns, and is disposed such that the central axis of the outer shape of the main coil 300 coincides with the vertical axis. Further, the main coil 300 is a planar coil extending in the horizontal direction or extending obliquely with respect to the horizontal direction.

Both ends of a line constituting the main coil 300 are opened. Further, a power feed terminal 300*a* is disposed at or near the midpoint of the line constituting the main coil 300. The power feed terminal 300*a* is connected to the first RF generator 31*a* of the power supply 30, i.e. to the RF potential. Further, a ground terminal 300*b* is disposed near the midpoint of the line constituting the main coil 300. The ground terminal 300*b* is connected to ground, i.e., to the ground potential. The main coil 300 is configured to resonate at a half of a wavelength A of an RF power supplied from the first RF generator 31*a*. A voltage generated at the line constituting the main coil 300 is distributed such that it becomes minimum near the midpoint of the line and becomes maximum at both ends of the line. Further, a current generated at the line constituting the main coil 300 is distributed such that it becomes maximum near the midpoint of the line and becomes minimum at both ends of the line. A frequency and power of the first RF generator 31*a* for supplying an RF power to the main coil 300 are variable.

Figure 7:
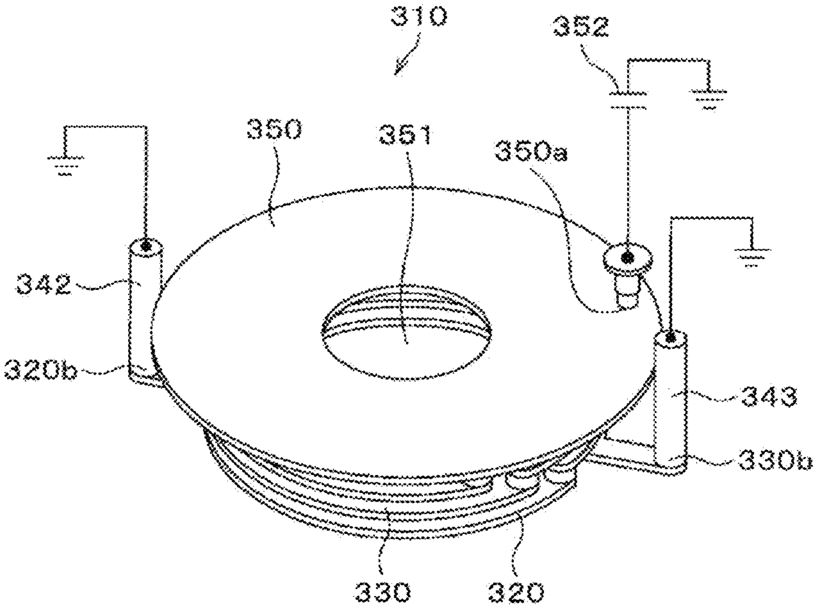
FIG. 7 is a top perspective view showing a schematic configuration of a sub-antenna according to the second embodiment.
Figure 8:
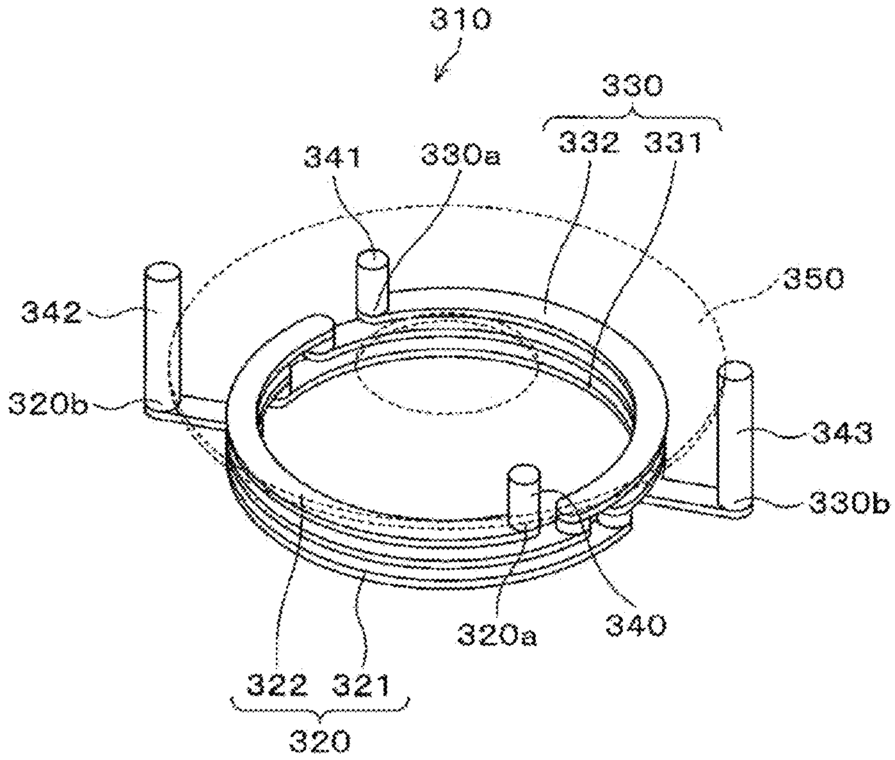
FIG. 8 is a top perspective view showing the schematic configuration of the sub-antenna according to the second embodiment.
Figure 9:
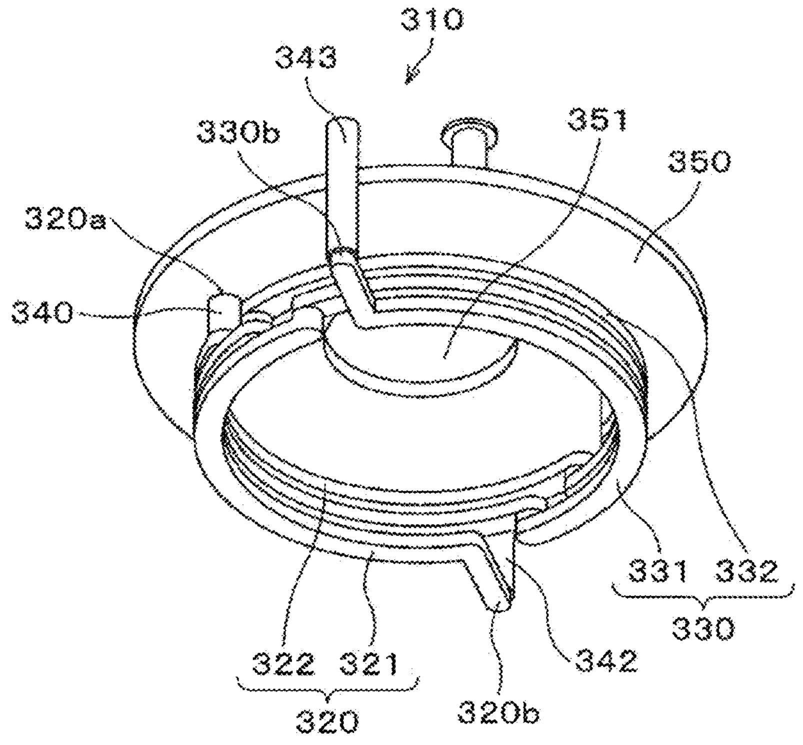
FIG. 9 is a bottom perspective view showing the schematic configuration of the sub-antenna according to the second embodiment.

FIGS. 7 and 8 are top perspective views showing a schematic configuration of the sub-antenna 310. FIG. 9 is a bottom perspective view showing the schematic configuration of the sub-antenna 310.

The sub-antenna 310 has a first coil assembly 320, a second coil assembly 330, connecting members 340 to 343, a conductive plate 350, and a conductive cylindrical portion 360.

Each of the first coil assembly 320 and the second coil assembly 330 has a spiral structure. The first coil assembly 320 has one or more turns and the second coil assembly 330 has one or more turns. Each turn of the first coil assembly 320 and each turn of the second coil assembly 330 are arranged alternately in the vertical direction when viewed from the side. The central axis of the outer shape of the first coil assembly 320 and the central axis of the outer shape of the second coil assembly 330 coincide with the vertical axis, and the first coil assembly 320 and the second coil assembly 330 are arranged coaxially. The first coil assembly 320 and the second coil assembly 330 are formed in a substantially circular shape in plan view. Further, the diameters of the turns of the first coil assembly 320 are the same, and the diameters of the turns of the second coil assembly 330 are the same. As described above, the sub-antenna 310 has a substantially cylindrical double helical structure.

In the illustrated example, the number of turns (the number of windings) of the first coil assembly 320 and the second coil assembly 330 is 1.5. However, the number of turns thereof is not limited thereto, and may be set to any number of turns of 1 or more. For example, the number of turns of the first coil assembly 320 and the second coil assembly 330 may be two or more.

The first coil assembly 320 has a first coil segment 321 and a first spiral coil segment 322. The first coil segment 321 extends in the horizontal direction or extends obliquely with respect to the horizontal direction, and is disposed at a bottom portion of the first coil assembly 320. The first spiral coil segment 322 is disposed in a spiral shape in the vertical direction from the first coil segment 321. A first upper coil terminal 320*a* is disposed at an upper end of the first coil assembly 320 (the end of the first spiral coil segment 322), and a first lower coil terminal 320*b* is disposed at a lower end of the first coil assembly 320 (the end of the first coil segment 321).

The second coil assembly 330 has a second coil segment 331 and a second spiral coil segment 332. The second coil segment 331 extends in the horizontal direction or extends obliquely with respect to the horizontal direction, and is disposed at a bottom portion of the second coil assembly 330. The second spiral coil segment 332 is disposed in a spiral shape in the vertical direction from the second coil segment 331. A second upper coil terminal 330*a* is disposed at an upper end of the second coil assembly 330 (the end of the second spiral coil segment 332), and a second lower coil terminal 330*b* is disposed at a lower end of the first coil assembly 320 (the end of the first coil segment 321).

The first upper coil terminal 320*a* and the second upper coil terminal 330*a* are arranged at symmetrical positions with respect to the center of the sub-antenna 310, i.e., at positions where the central angle formed by the adjacent upper coil terminals is about 180 degrees. Further, the first upper coil terminal 320*a* and the second upper coil terminal 330*a* are axially symmetric with respect to a plate terminal 350*a* to be described later. In other words, the distance between the first upper coil terminal 320*a* and the plate terminal 350*a* is the same as the distance between the second upper coil terminal 330*a* and the plate terminal 350*a*. The first lower coil terminal 320*b* and the second lower coil terminal 330*b* are also arranged at symmetrical positions with respect to the center of the sub-antenna 310, i.e., at positions where the central angle formed by the adjacent lower coil terminals is about 180 degrees.

The first upper coil terminal 320*a* is connected to a bottom surface of the conductive plate 350 through the connecting member 340. The second upper coil terminal 330*a* is connected to the bottom surface of the conductive plate 350 through the connecting member 341. The first upper coil terminal 320*a* and the second upper coil terminal 330*a* may be connected to an upper surface of the conductive plate 350.

The first lower coil terminal 320*b* is connected to the ground, i.e., to the ground potential, through the connecting member 342. The second lower coil terminal 330*b* is connected to the ground, i.e., to the ground potential, through the connecting member 343. As described above, the sub-antenna 310 is not connected to the power supply 30, so that an RF power is not directly supplied to the sub-antenna 310.

The arrangement of the first upper coil terminal 320*a* and the second upper coil terminal 330*a* and the arrangement of the first lower coil terminal 320*b* and the second lower coil terminal 330*b* in plan view are not particularly limited. Since, however, a voltage difference between the first and second upper coil terminals 320*a* and 330*a* and the first and second lower coil terminals 320*b* and 330*b* is large, it is practically preferable to maintain a certain gap.

The conductive plate 350 is disposed above the first coil assembly 320 and the second coil assembly 330. In other words, the conductive plate 350 is separated from the plasma processing space 10*s* where plasma is generated, and in disposed near the conductor plate 15. Further, the conductive plate 350 is disposed around the substantially cylindrical central gas injector 13 to surround the central gas injector 13. The conductive plate 350 has a substantially circular shape in plan view, and has a central opening 351. The shape of the conductive plate 350 is not particularly limited, and may be, e.g., a rectangular shape. The central gas injector 13 is inserted into the central opening 351. The plate terminal 350*a* is disposed on the upper surface of the conductive plate 350. The plate terminal 350*a* may be disposed on the bottom surface of the conductive plate 350. The plate terminal 350*a* is connected to the ground, i.e., to the ground potential, through the capacitor 352. The plate terminal 350*a* may be directly connected to the ground potential, or may be connected to the ground potential through another electric element such as a coil or the like. In other words, the plate terminal 350*a* is directly or indirectly connected to the ground potential. The capacitor 352 includes a variable capacitance capacitor. The capacitor 352 is not limited to that of the second embodiment, and may be a capacitor having a fixed capacitance, or may include a plurality of capacitors including a variable capacitance capacitor and/or a fixed capacitance capacitor. In the above embodiment, the plate terminal 350*a* and the lower coil terminals 320*b* and 330*b* are connected to the ground potential through the capacitor 352. On the other hand, the plate terminal 350*a* and the lower coil terminals 320*b* and 330*b* may be connected to the ground potential through another conductive plate. In that case as well, the same effect as that of the above embodiment can be obtained.

The conductive cylindrical portion 360 has the same configuration as the conductive cylindrical portion 230 of the first embodiment. In other words, the conductive cylindrical portion 360 is disposed around the central gas injector 13 to surround the central gas injector 13 inside the central opening 351. The conductive cylindrical portion 360 extends downward from the central opening 351 to a position on or above the dielectric window 101. The conductive cylindrical portion 360 may be connected to the conductive plate 350, or may be separately provided without being connected to the conductive plate 350.

The sub-antenna 310 is inductively coupled to the main coil 300, and a current flows through the sub-antenna 310 in a direction that cancels the magnetic field generated by the current flowing through the main coil 300. By controlling the capacitance of the capacitor 352, it is possible to control the direction or magnitude of the current flowing through the sub-antenna 310 with respect to the current flowing through the main coil 300.

(Action of Antenna)

In the antenna unit 14 configured as described above, a magnetic field is generated in the vertical axis direction by the current flowing through the main coil 300 and the current flowing through the sub-antenna 310, and an induced electric field is generated in the plasma processing chamber 10 by the generated magnetic field. Due to the induced electric field generated in the plasma processing chamber 10, plasma is produced from the processing gas supplied from the central gas injector 13 into the plasma processing chamber 10. Then, plasma processing such as etching, film formation, or the like is performed on the substrate W on the central region 111*a* by ions or active species in the plasma.

(Effect of Antenna)

Here, in a comparative example, when the configuration of the sub-antenna 310 does not include the conductive plate 350 and the connecting members 340 and 341 are connected to each other and connected to the ground through the capacitor 352, the same problem as that of the conventional antenna is caused. In other words, in the comparative example, the ratio of the current distribution to the first coil assembly 320 and the second coil assembly 330 is biased. As a result, the circumferential uniformity of the magnetic field strength deteriorates. On the other hand, in the antenna unit 14 of the second embodiment, the plate-shaped conductive plate 350 serves as a current branching portion, so that the induction coupling does not occur, and there is no bias in the ratio of the current distribution to the first coil assembly 320 and the second coil assembly 330. Hence, the circumferential uniformity of the magnetic field strength can be improved.

Further, in the comparative example, the magnetic force lines freely pass between the first coil assembly 320 and the second coil assembly 330, so that a dielectric electromotive force is generated and the magnetic field generation efficiency deteriorates. On the other hand, in the antenna unit 14 of the second embodiment, the plate-shaped conductive plate 350 does not allow the magnetic force lines to pass therethrough, so that it is possible to suppress the inflow of extra magnetic force lines. As a result, the magnetic field generation efficiency can be improved. In the second embodiment, although the magnetic field generation efficiency can be improved compared to the comparative example, the effect of improving the magnetic field generation efficiency may be small due to the presence of the central opening 351 of the conductive plate 350. Therefore, the effect of improving the magnetic field generation efficiency can be enhanced by providing a slit 370 in the conductive plate 350 as in a modification to be described later.

Modification of Second Embodiment

Figure 10:
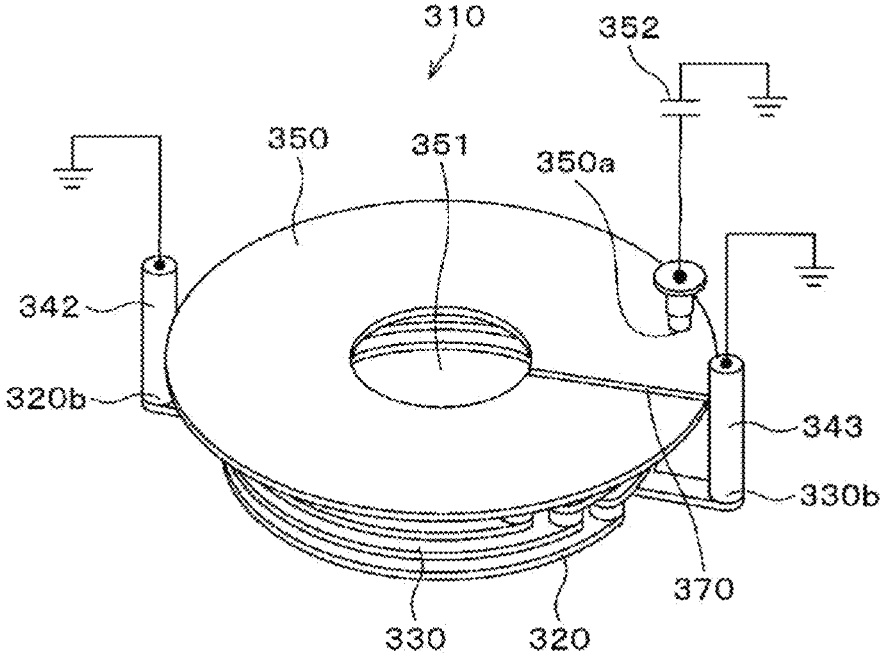
FIG. 10 is a top perspective view showing a schematic configuration of a sub-antenna according to a modification of the second embodiment.

As shown in FIG. 10, in the sub-antenna 310 of the second embodiment, the conductive plate 350 may have the slit 370 extending radially from the central opening 211 to an outer end portion (outer edge) of the conductive plate 350. The slit 370 is formed to separate the conductive plate 350, and the current in the conductive plate 350 is changed by the slit 370 as will be described later.

The present inventors have studied and found that the circumferential uniformity of the magnetic field strength is slightly lower when the slit 370 is formed than when the slit 370 is not formed, whereas the magnetic field generation efficiency can be improved. They also have found that the circumferential uniformity of the magnetic field strength and the generation efficiency of the magnetic field vary depending on the position of the slit 370 in the conductive plate 350.

Referring to FIGS. 11A to 11D, the variation in the circumferential uniformity of the magnetic field strength and the magnetic field generation efficiency will be described. FIGS. 11A to 11D explain the currents depending on the existence/non-existence of the slit 370 and the position of the slit 370 in the conductive plate 350. Hereinafter, the circumferential uniformity of the magnetic field strength will be referred to as bias B. The bias B indicates a ratio of a difference between a maximum value and a minimum value with respect to an average value of the magnetic field in the magnetic field distribution of one round (360 degrees). Further, the magnetic field generation efficiency will be referred to as efficiency E. The efficiency E indicates the strength of the magnetic field generated in the plasma by the sub-antenna 310 per unit length.

(Pattern 1)

Figure 11A:
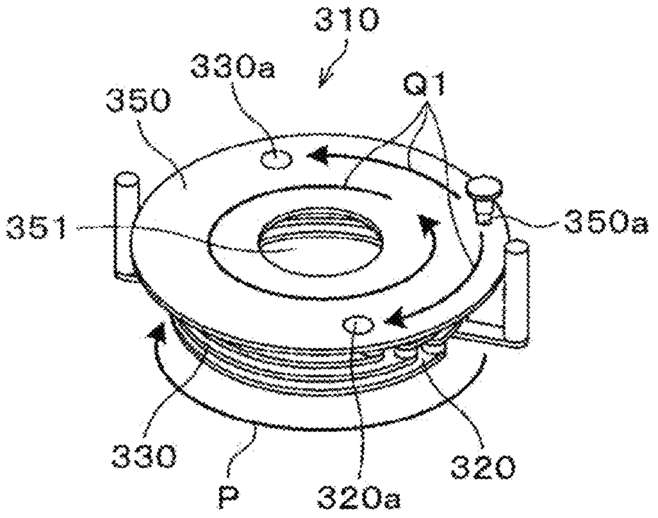
FIGS. 11A to 11D explains a current flowing through a conductive plate in the second embodiment.

In a pattern 1, the slit 370 is not formed in the conductive plate 350 as shown in FIG. 11A. In the pattern 1, induced currents Q1 flow through the conductive plate 350 with respect to a current P flowing through the first coil assembly 320 and the second coil assembly 330. In that case, the bias B1 can be suppressed. Since, however, the induced currents Q1 is cancelled out with respect to the current P, the efficiency E1 decreases.

(Pattern 2)

Figure 11B:
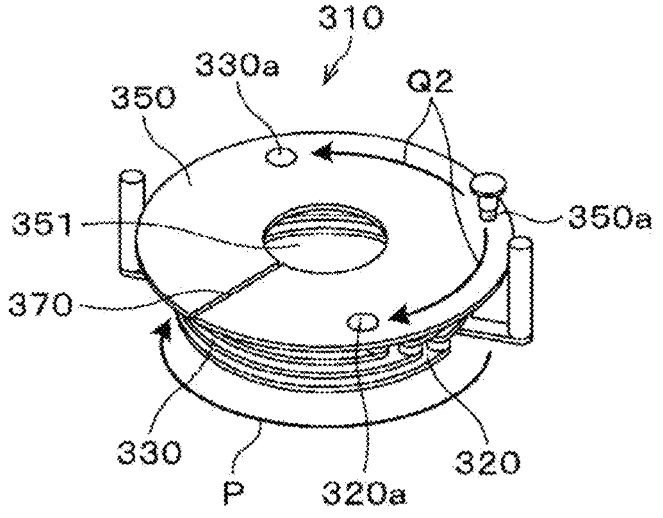

In a pattern 2, as shown in FIG. 11B, in plan view, the slit 370 is formed between the first upper coil terminal 320*a* and the second upper coil terminal 330*a*, and is formed on the opposite side of the plate terminal 350*a*. In that case, since the slit 370 is formed, induced currents Q2 do not go around the conductive plate 350 and becomes smaller than the induced currents Q1 of the pattern 1. Therefore, the efficiency E2 of the pattern 2 becomes higher than the efficiency E1 of the pattern 1. However, the bias B2 of the pattern 2 becomes greater than the bias B1 of the pattern 1.

(Pattern 3)

Figure 11C:
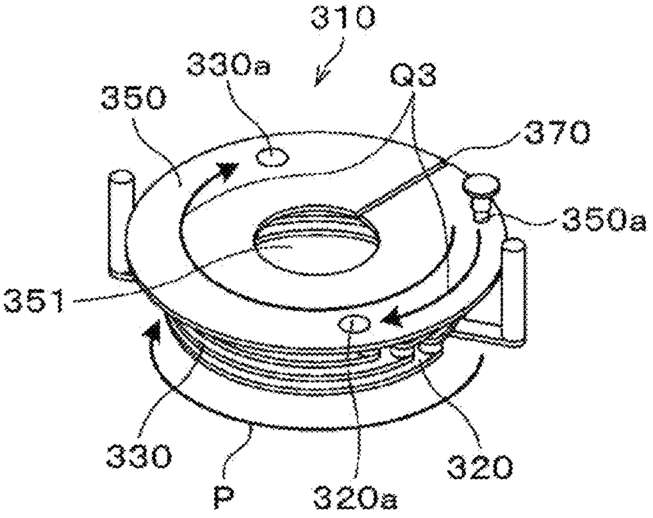

In a pattern 3, the slit 370 is formed near the plate terminal 350*a* in plan view as shown in FIG. 11C. In that case, the entire induced current Q3 flows in the same direction as that of the current P, so that the efficiency E3 increases. However, the bias B3 of the pattern 3 becomes further greater than the bias B2 of the pattern 2.

(Pattern 4)

Figure 11D:
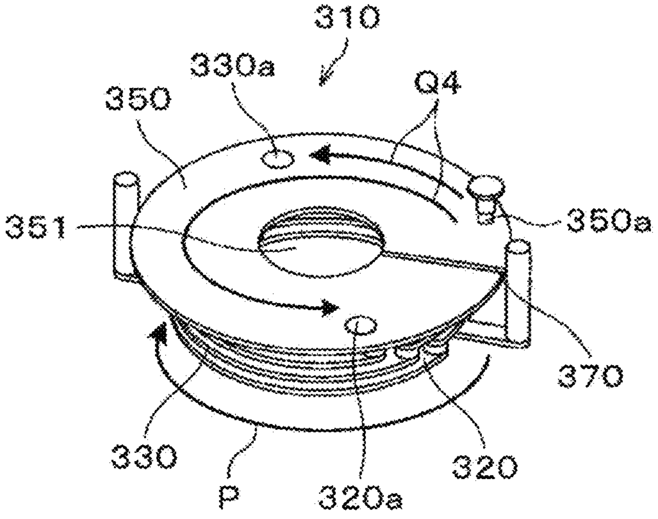

In a pattern 4, the slit 370 is formed between the plate terminal 350*a* and the first upper coil terminal 320*a* in plan view as shown in FIG. 11D. In that case, the entire induced current Q4 flows in the opposite direction to that of the current P, so that the efficiency E4 decreases. However, the bias B4 of the pattern 4 can be suppressed.

To sum up, the bias B satisfies a relationship of B1<B4<B2<B3. On the other hand, the efficiency E satisfies a relationship of E3>E2>E4>E1. The existence/non-existence and position of the slit 370 are appropriately designed such that the bias B and the efficiency E satisfy the specifications.

The slit 370 formed in the conductive plate 350 in the second embodiment may be formed in the inner conductive plate 210 in the first embodiment. In that case as well, the above-described effect can be obtained.

Modification of Second Embodiment

Figure 12:
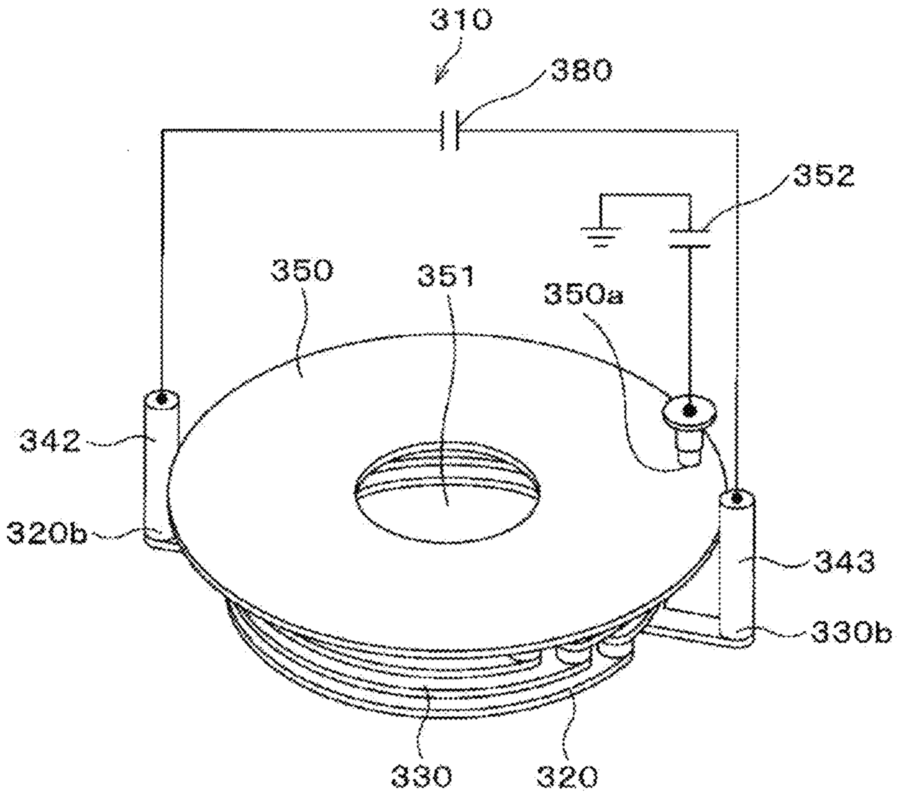
FIG. 12 is a top perspective view showing the schematic configuration of the sub-antenna according to the modification of the second embodiment.

In the second embodiment, the first lower coil terminal 320*b* and the second lower coil terminal 330*b* are connected to the ground. However, as shown in FIG. 12, the first lower coil terminal 320*b* and the second lower coil terminal 330*b* may be connected through a capacitor 380. The capacitor 380 includes a variable capacitance capacitor.

Further, each of the first lower coil terminal 320*b* and the second lower coil terminal 330*b* may be in a floating state.

Further, each of the first lower coil terminal 320*b* and the second lower coil terminal 330*b* may be connected to the RF potential. In that case, each of the first coil assembly 320 and the second coil assembly 330 can be used alone.

Modification of Second Embodiment

In the second embodiment, the sub-antenna 310 is disposed at a radially inner side of the main coil 300. However, the sub-antenna 310 may be disposed at a radially outer side of the main coil 300. Further, the sub-antenna 310 may be disposed both at the radially inner side and the radially outer side of the main coil 300. That is, the antenna assembly may have a first sub-antenna disposed at the radially inner side of the main coil 300 and a first sub0antenna disposed at the radially outer side of the main coil 300. Further, the sub-antenna 310 may be disposed below and/or above the main coil 300.

Third Embodiment

Figure 13:
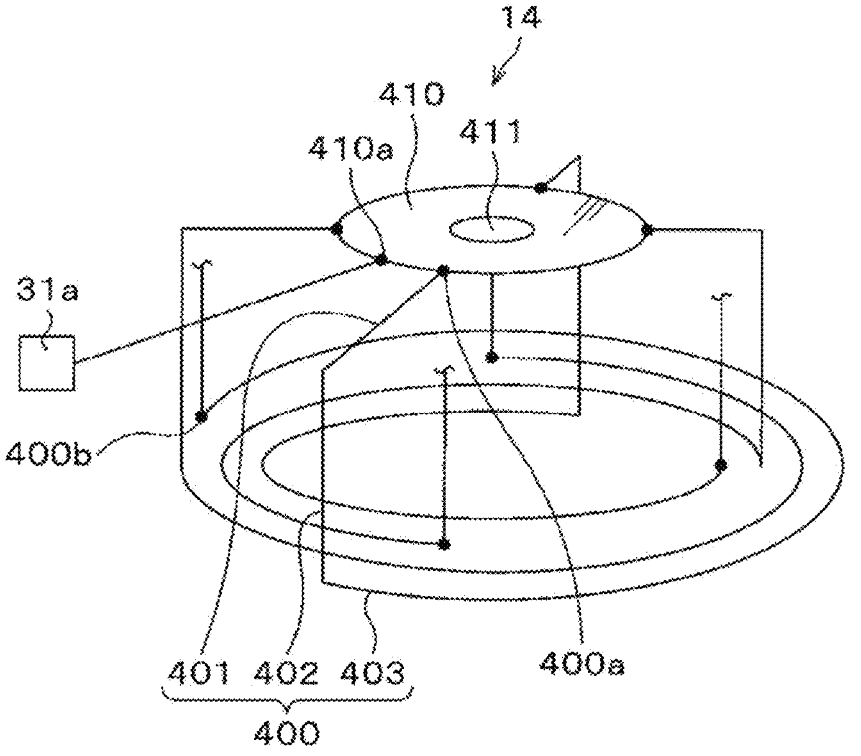
FIG. 13 is a perspective view showing a schematic configuration of an antenna unit according to a third embodiment.

Next, a configuration example of the antenna unit 14 according to the third embodiment will be described. FIG. 13 is a perspective view showing a schematic configuration of the antenna unit 14.

The antenna unit 14 has a coil assembly 400, a conductive plate 410, and a conductive cylindrical portion (not shown). The conductive cylindrical portion has the same configuration as that of the conductive cylindrical portion 230 of the first embodiment.

A plurality of coil assemblies 400 are provided. In the illustrated example, four coil assemblies 400 are provided, but the number of coil assemblies 400 is not particularly limited. The coil assemblies 400 are arranged above the dielectric window 101.

Each coil assembly 400 has a first coil segment 401, a vertical coil segment 402, and a second coil segment 403. The first coil segment 401 extends in the horizontal direction or extends obliquely with respect to the horizontal direction, and is connected to a side surface of the conductive plate 410 through a coil terminal 400*a*. The vertical coil segment 402 extends vertically downward from the first coil segment 401. The second coil segment 403 extends in the horizontal direction from the vertical coil segment 402 or extends obliquely in a substantially circular shape with respect to the horizontal direction, and is disposed at a bottom portion of the coil assembly 400. A coil terminal 400*b* is disposed at an end portion of the second coil segment 403. The coil terminal 400*b* may be connected to any portion, and may be connected to the ground potential, for example.

The coil assemblies 400 are axially symmetric with respect to the center of the conductive plate 410. In other words, the coil terminals 400*a* are arranged at equal intervals in the circumferential direction about the central opening 411 of the conductive plate 410. Similarly, the coil terminals 400*b* are arranged at equal intervals in the circumferential direction about the central opening 411.

The conductive plate 410 has the same configuration as that of the inner conductive plate 210 of the first embodiment. The conductive plate 410 has the central opening 411 into which the central gas injector 13 is inserted. A plate terminal 410*a* is disposed on the side surface of the conductive plate 410. The plate terminal 410*a* is connected to the first RF generator 31*a* of the power supply 30, i.e., to the RF potential.

Also in the third embodiment, the same effect as that of the first embodiment can be obtained.

Fourth Embodiment

Figure 14:
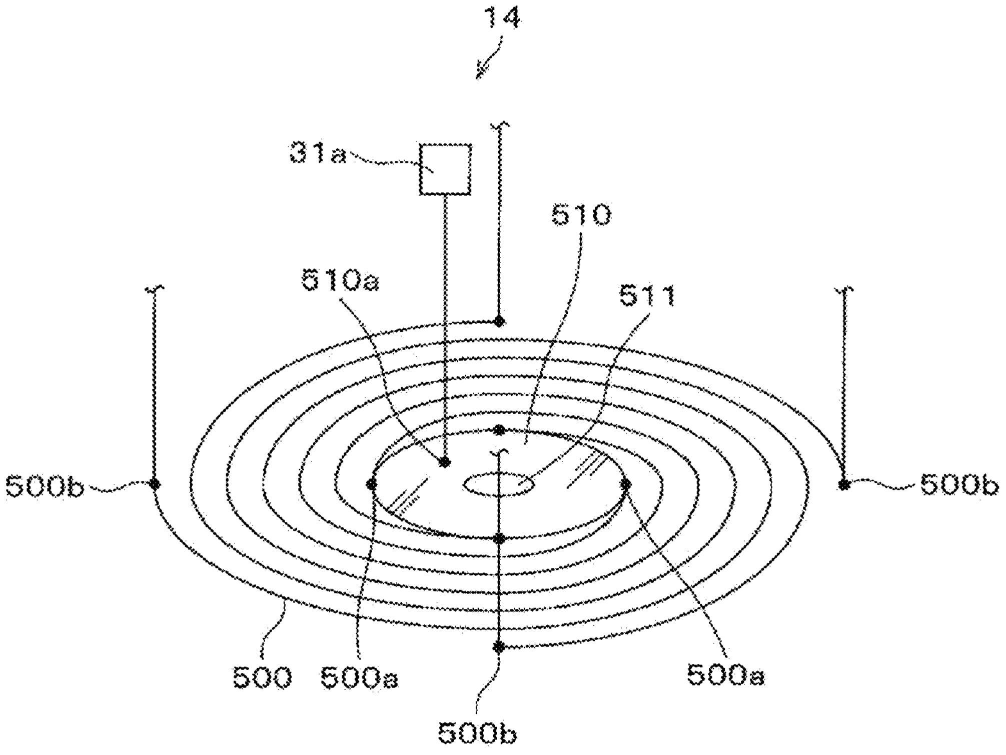
FIG. 14 is a perspective view showing a schematic configuration of an antenna unit according to a fourth embodiment.

Next, a configuration example of the antenna unit 14 according to the fourth embodiment will be described. FIG. 14 is a perspective view showing a schematic configuration of the antenna unit 14.

The antenna unit 14 has a coil assembly 500, a conductive plate 510, and a conductive cylindrical portion (not shown). The conductive cylindrical portion has the same configuration as the conductive cylindrical portion 230 of the first embodiment.

A plurality of coil assemblies 500 are provided. In the illustrated example, four coil assemblies 500 are provided. However, the number of coil assemblies 500 is not particularly limited. The coil assemblies 500 are arranged above the dielectric window 101.

Each coil assembly 500 extends in a horizontal direction on the same plane as the conductive plate 510 or extends obliquely with respect to the horizontal direction, and is formed in a substantially circular spiral shape of two or more turns. A coil terminal 500*a* disposed at one end of the coil assembly 500 is connected to a side surface of the conductive plate 510. A coil terminal 500*b* disposed at the other end of the coil assembly 500 may be connected to any portion, and is connected to the ground potential, for example.

The coil assemblies 500 are axially symmetric with respect to the center of the conductive plate 510. In other words, the coil terminals 500*a* are arranged at equal intervals in the circumferential direction about a central opening 511 of the conductive plate 510. Similarly, the coil terminals

500*b* are arranged at equal intervals in the circumferential direction about the central opening 511.

The conductive plate 510 has the same configuration as that of the inner conductive plate 210 of the first embodiment. The conductive plate 510 has the central opening 511 into which the central gas injector 13 is inserted. A plate terminal 510*a* is disposed on an upper surface of the conductive plate 510. The plate terminal 510*a* may be disposed on the upper surface of the conductive plate 510. The plate terminal 510*a* is connected to the first RF generator 31*a* of the power supply 30, i.e., to the RF potential.

Also in the fourth embodiment, the same effect as that of the first embodiment can be obtained.

The above-described embodiments are illustrative in all respects and are not restrictive. The above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. An antenna for inductively coupled plasma excitation, the antenna comprising:

a plurality of coil assemblies; and a conductive plate electrically connected to the plurality of coil assemblies to prevent induction coupling and bias in a ratio of current distribution among the plurality of coil assemblies, the conductive plate having a central opening and at least one plate terminal, wherein the conductive plate is disposed on at least one of the plurality of coil assemblies and has a substantially circular shape, the plurality of coil assemblies are axially symmetric with respect to a center of the conductive plate, the plurality of coil assemblies include:

a first coil assembly having a first coil segment extending in a horizontal direction or extending obliquely with respect to the horizontal direction and a first coil terminal; and a second coil assembly having a second coil segment extending in the horizontal direction or extending obliquely with respect to the horizontal direction and a second coil terminal, each turn of the first coil assembly and each turn of the second coil assembly are arranged alternately in the vertical direction when viewed from the side, and the conductive plate is configured to radially surround a gas injector, with the gas injector extending through the central opening of the conductive plate.

2. The antenna for inductively coupled plasma excitation of claim 1, wherein the at least one plate terminal is directly or indirectly connected to a ground potential or an RF potential.

3. The antenna for inductively coupled plasma excitation of claim 1, further comprising:

a conductive cylindrical portion extending downward from the central opening or a vicinity of the central opening.

4. The antenna for inductively coupled plasma excitation of claim 1, wherein each of the plurality of coil assemblies has a coil segment having one or more turns, and the conductive plate has an upper surface having said at least one plate terminal and a bottom surface connected to the plurality of coil assemblies.

5. The antenna for inductively coupled plasma excitation of claim 4, wherein the coil segment is disposed at a bottom portion of the coil assembly.

6. The antenna for inductively coupled plasma excitation of claim 1, wherein the conductive plate has a slit extending radially from an outer edge of the conductive plate to the central opening along a top surface of the conductive plate.

7. The antenna for inductively coupled plasma excitation of claim 6, wherein the slit is formed between the first coil terminal and the second coil terminal in plan view.

8. The antenna for inductively coupled plasma excitation of claim 6, wherein the slit is formed on the opposite side of the at least one plate terminal with respect to the first coil terminal and the second coil terminal in plan view.

9. The antenna for inductively coupled plasma excitation of claim 6, wherein the slit is formed near the at least one plate terminal in plan view.

10. The antenna for inductively coupled plasma excitation of claim 6, wherein the slit is formed between the at least one plate terminal and the first coil terminal in plan view.

11. An antenna unit for inductively coupled plasma excitation, comprising:

a main antenna having a power feed terminal connected to an RF potential; and a sub-antenna disposed inside or outside the main antenna, wherein the sub-antenna includes:

a plurality of coil assemblies; and a conductive plate electrically connected to the plurality of coil assemblies to prevent induction coupling and bias in a ratio of current distribution among the plurality of coil assemblies, the conductive plate having a central opening and at least one plate terminal, the conductive plate is disposed on at least one of the plurality of coil assemblies and has a substantially circular shape, RF power is not directly supplied to the sub-antenna, the sub-antenna is inductively coupled to the main antenna, and the plurality of coil assemblies are axially symmetric with respect to a center of the conductive plate.

12. The antenna unit for inductively coupled plasma excitation of claim 11, wherein the plurality of coil assemblies include:

a first coil assembly having a first coil segment extending in a horizontal direction or extending obliquely with respect to the horizontal direction and a first coil terminal; and a second coil assembly having a second coil segment extending in the horizontal direction or extending obliquely with respect to the horizontal direction and a second coil terminal, wherein the first coil assembly includes one or more turns, and wherein the second coil assembly includes one or more turns.

13. The antenna unit for inductively coupled plasma excitation of claim 12, wherein the first coil segment is disposed at a bottom portion of the first coil assembly, and wherein the second coil segment is disposed at a bottom portion of the second coil assembly.

14. The antenna unit for inductively coupled plasma excitation of claim 12, wherein the conductive plate has a slit extending radially from an outer edge of the conductive plate to the central opening.

15. The antenna unit for inductively coupled plasma excitation of claim 12, wherein each turn of the first coil assembly and each turn of the second coil assembly are arranged alternately in the vertical direction when viewed from the side.

16. The antenna unit for inductively coupled plasma excitation of claim 12, wherein the main antenna includes a main coil formed in a circular spiral shape of two or more turns.

17. The antenna unit for inductively coupled plasma excitation of claim 15, wherein the conductive plate is configured to radially surround a gas injector and to be radially spaced from the gas injector.

18. The antenna unit for inductively coupled plasma excitation of claim 17, wherein each of the first coil assembly and second coil assembly has two or more turns.

19. The antenna unit for inductively coupled plasma excitation of claim 1, wherein each of the first coil assembly and second coil assembly has two or more turns.

20. The antenna unit for inductively coupled plasma excitation of claim 14, wherein each turn of the first coil assembly and each turn of the second coil assembly are arranged alternately in the vertical direction when viewed from the side, and the conductive plate is configured to radially surround a gas injector, with the gas injector extending through the central opening of the conductive plate.

* * * * *